US007196520B2

(12) United States Patent
Shen et al.

(10) Patent No.: US 7,196,520 B2
(45) Date of Patent: Mar. 27, 2007

(54) METHOD AND APPARATUS FOR PASSIVE SHIMMING OF MAGNETS

(75) Inventors: Weijun Shen, Florence, SC (US); Minfeng Xu, Florence, SC (US); Bu-Xin Xu, Florence, SC (US)

(73) Assignee: General Electric Company, Schenectady, NY (US)

( * ) Notice: Subject to any disclaimer, the term of this patent is extended or adjusted under 35 U.S.C. 154(b) by 85 days.

(21) Appl. No.: 10/904,094

(22) Filed: Oct. 22, 2004

(65) Prior Publication Data

US 2006/0208732 A1 Sep. 21, 2006

(51) Int. Cl.
  *G01V 3/00* (2006.01)
(52) U.S. Cl. ...................................... 324/319; 324/318
(58) Field of Classification Search ................ 324/320, 324/318, 319, 322, 309, 307, 300, 321; 335/216, 335/296
  See application file for complete search history.

(56) References Cited

U.S. PATENT DOCUMENTS

| 5,045,794 | A | | 9/1991 | Dorri et al. ................. 324/320 |
| 5,635,839 | A | * | 6/1997 | Srivastava et al. ........... 324/320 |
| 5,642,087 | A | * | 6/1997 | Crow .......................... 335/216 |
| 5,999,076 | A | | 12/1999 | Becker, Jr. et al. ......... 335/301 |
| 6,181,137 | B1 | * | 1/2001 | Havens et al. ............... 324/320 |
| 6,294,972 | B1 | * | 9/2001 | Jesmanowicz et al. ...... 335/301 |
| 6,627,003 | B2 | * | 9/2003 | Hayworth et al. .......... 148/104 |
| 6,778,054 | B1 | * | 8/2004 | Huang et al. ............... 335/301 |

FOREIGN PATENT DOCUMENTS

JP          63205586      *   8/1988

\* cited by examiner

*Primary Examiner*—Brij B. Shrivastav
(74) *Attorney, Agent, or Firm*—Cantor Colburn LLP

(57) ABSTRACT

An apparatus and method for shimming a magnetic field of a magnet in a volume of interest includes a nonmagnetic holder configured with an array of fluid containing pockets; and a solidified ferromagnetic fluid in each pocket of the array of fluid containing pockets, wherein the solidified ferromagnetic fluid is fabricated from a ferromagnetic fluid, a diluting liquid, a hardener, and an accelerator agent. The ferromagnetic fluid includes a carrier liquid, ferromagnetic particles, and a surfactant.

22 Claims, 4 Drawing Sheets

METHOD AND APPARATUS FOR PASSIVE SHIMMING OF MAGNETS

BACKGROUND OF THE INVENTION

This invention relates generally to a method and apparatus for passively shimming a magnet to correct deviations from a desired magnetic field. Methods and apparatus of the present invention are particularly useful in conjunction with magnetic resonance imaging (MRI) apparatus for correcting magnetic field inhomogeneities resulting from manufacturing tolerances. Although the examples cited herein involve MRI apparatus and superconducting magnets, the usefulness of the invention is not limited solely to such apparatus or magnets.

A high uniform magnetic field is useful for using magnetic resonance image (MRI) and nuclear magnetic resonance (NMR) systems as a medical device or a chemical/biological device. At least some popular MRI systems currently available utilize a superconducting magnet that creates a uniform field in a defined image volume of about 0.5 Tesla to about 9.4 Tesla in a pre-determined space (i.e., an imaging volume, or volume of interest).

Some types of materials can be made superconducting by placement in an extremely cold environment, such as a cryostat or pressure vessel containing cryogenic material. In the case of a magnet coil, such as those used in an MRI apparatus, extreme cold is used to make the magnet coils superconducting. In such a state, an initial current produced in the coil continues to flow even after power is removed. Superconducting magnets find wide application in the field of MRI due to their high magnetic field strength.

For proper operation of known MRI apparatus, the magnetic field of the magnet must be uniform in a defined image volume within a specified tolerance, often about 10 ppm. To compensate for inhomogeneities, MRI magnets, including superconducting magnets, are often shimmed utilizing various arrangements of correction coils and/or passive ferromagnetic shim materials.

MRI magnets are not immune to field inhomogeneity due to coil deformation and coil misalignment. Known superconducting magnet designs have been directed at minimizing such inhomogeneity during the design stage. To remove inhomogeneity that remains after the manufacturing cycle due to manufacturing tolerances, environmental effects, and/or design restrictions, passive shim systems have been used.

Various shimming methods for MRI magnets are known. At least one known method utilizes a combination of correction coils and passive ferromagnetic shims. The superconducting magnet is adjusted at the factory utilizing these coils and shims to provide a homogeneous magnetic field in the imaging bore of the magnet, which is also referred to herein as a "volume of interest." Passive shims are positioned between a warm imaging bore and a gradient coil. As a result, in known MRI systems, it is difficult to access and adjust or change passive shims after the gradient coil is installed while minimizing the profile or space occupied by the shim assembly. However, due to magnetic material in the vicinity of the magnet at the installation site, it is frequently necessary to reshim the magnet to provide a specified field homogeneity.

Known passive shimming systems are difficult to adjust on-site. Thus, on-site adjustment has frequently been limited to varying the current through the correction coils. However, it is expensive to provide correction coils, associated circuitry and leads for this purpose.

Figure 1:
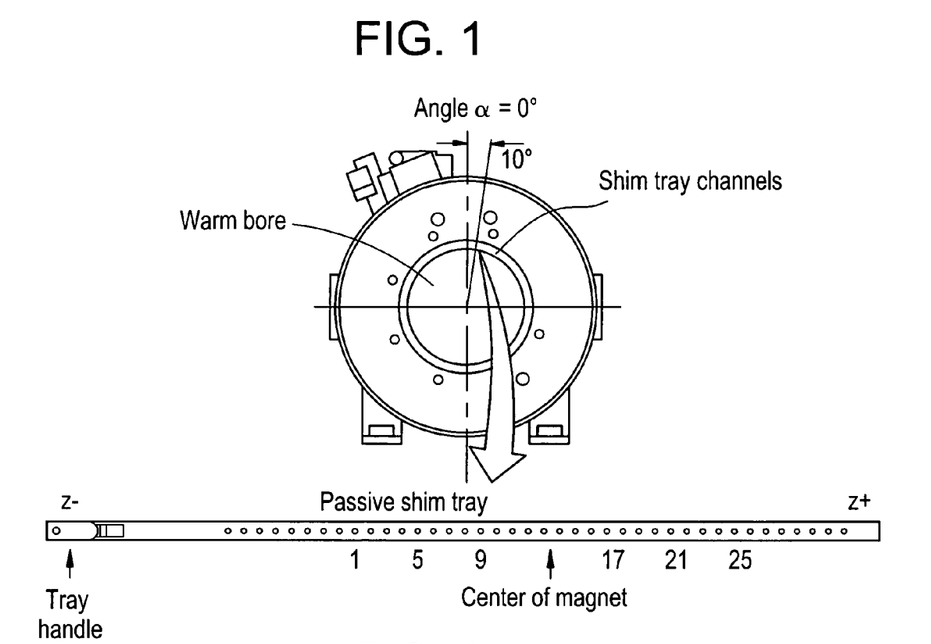
FIG. 1 is a front elevation view of a typical magnet and a side view of one of a plurality of circumferentially disposed passive shim trays removed therefrom.
Figure 2:
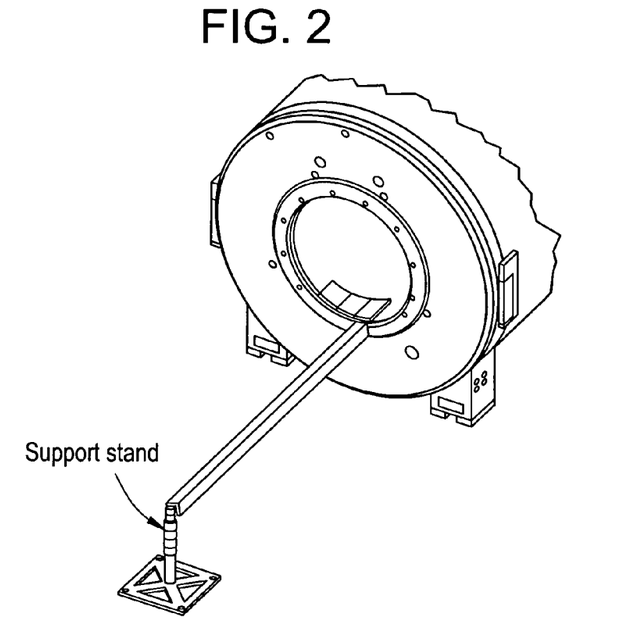
FIG. 2 is a partial perspective view of the magnet of FIG. 1 depicting loading and unloading one of the shim trays.

Referring to FIGS. 1 and 2, at least one known MRI configuration provides passive shimming for a superconducting magnet using iron chips or similar ferromagnetic material before, after, or together with superconducting shimming. FIG. 1 is a schematic of the magnet with a removed shim tray, while FIG. 2 depicts the loading and unloading of the shim trays. Typically, the basic steps include (a) taking a field map by either using a field probe or a field camera, (b) calculating the field inhomogeneity and harmonics distribution, (c) calculating quantity and distribution of iron chips for passive shimming, (d) adding the iron chips to the shim trays outside of the magnet one-by-one according to the calculated results, (f) loading the shim trays into magnet bore, and (g) mapping the magnetic field again to verify the shimming effectiveness.

It is quite normal for a magnet to have a few shimming iterations to achieve the stringent uniformity requirement. The iteration process requires pulling out previously installed shim trays in order to modify (e.g., add/remove) iron shim chips, and then re-load these shim trays into the magnet again. Further, operators for the process have to deal with the magnetic interactive force, as well as having to manually load and unload shim chips. The process for passive shimming is a costly and labor-intensive process. In addition, the process is prone to error because of the manual loading and unloading shim chips.

In addition, current passive shimming calculations after field mapping includes a quantumize process. The quantumize process is needed as a result of the chips used in conventional passive shimming being categorized by a few manageable quantized or discrete sizes by either weight or dimension. The quantumize process lowers the accuracy (e.g., introducing errors) and increases the complexity of the shim chip distribution, hence increasing the cost.

Thus, there is a particular need for an MRI shimming method and system which provide improved magnetic field imaging homogeneity and yet which are uncomplex, eliminate errors associated with manual loading and unloading, and increase accuracy by providing flexibility over current discretely sized shims.

BRIEF DESCRIPTION OF THE INVENTION

The foregoing problems and disadvantages are overcome by a method and apparatus for passive shimming a magnet in accordance with the exemplary embodiments disclosed herein.

A passive shim assembly for shimming a magnetic field of a magnet in a volume of interest includes a nonmagnetic holder configured with an array of fluid containing pockets; and a solidified ferromagnetic fluid in each pocket of the array of fluid containing pockets, wherein the solidified ferromagnetic fluid is fabricated from a ferromagnetic fluid, a diluting liquid, a hardener, and an accelerator agent.

In another embodiment, an MRI apparatus includes a superconducting magnet having a magnetic field shimmed to an approximation of a uniform magnetic field within a volume of interest using a ferromagnetic fluid.

A method for shimming a magnetic field of a magnet in a volume of interest, wherein the magnet is configured to utilize, for shimming, a solidified ferromagnetic fluid positioned in a nonmagnetic holder having a predetermined number of pockets is provided. The method includes measuring the magnetic field of a magnet in a plurality of locations within the volume of interest. A nominal passive shimming location and quantity to compensate the measured magnetic field to approximate a desired magnetic field within the volume of interest is determined. A pocket with a ferromagnetic fluid and a diluting fluid according to the determined nominal passive shimming location and quantity is filled. The magnetic field of the magnet in a plurality of locations within the volume of interest is measured to determine a residual deviation from the desired magnetic field. The magnetic field is measured again to determine if it meets the desired magnetic field. The pocket of the ferromagnetic fluid and the diluting fluid is emptied if the desired magnetic field is not met. The pocket is filled with a hardener and an accelerator agent if the pocket meets the desired magnetic field.

A method for shimming, within an imaging volume, a magnetic field of a magnet of an MRI apparatus, wherein the magnet is configured to utilize, for shimming, a solidified ferromagnetic fluid positioned in a nonmagnetic holder having a predetermined number of fluid retaining pockets is also provided. The method includes measuring the magnetic field of the magnet in a plurality of locations within the imaging volume; determining a nominal passive shimming location and quantity to compensate the measured magnetic field to approximate a desired magnetic field within the imaging volume; and placing a combination of a ferromagnetic fluid and a diluting fluid in the pockets to approximate the nominal passive shimming location and quantity.

Other systems and/or methods according to the embodiments will be or become apparent to one with skill in the art upon review of the following drawings and detailed description. It is intended that at all such additional systems, methods, and/or computer program products be within the scope of the present invention, and be protected by the accompanying claims.

DETAILED DESCRIPTION OF THE INVENTION

Figure 3:
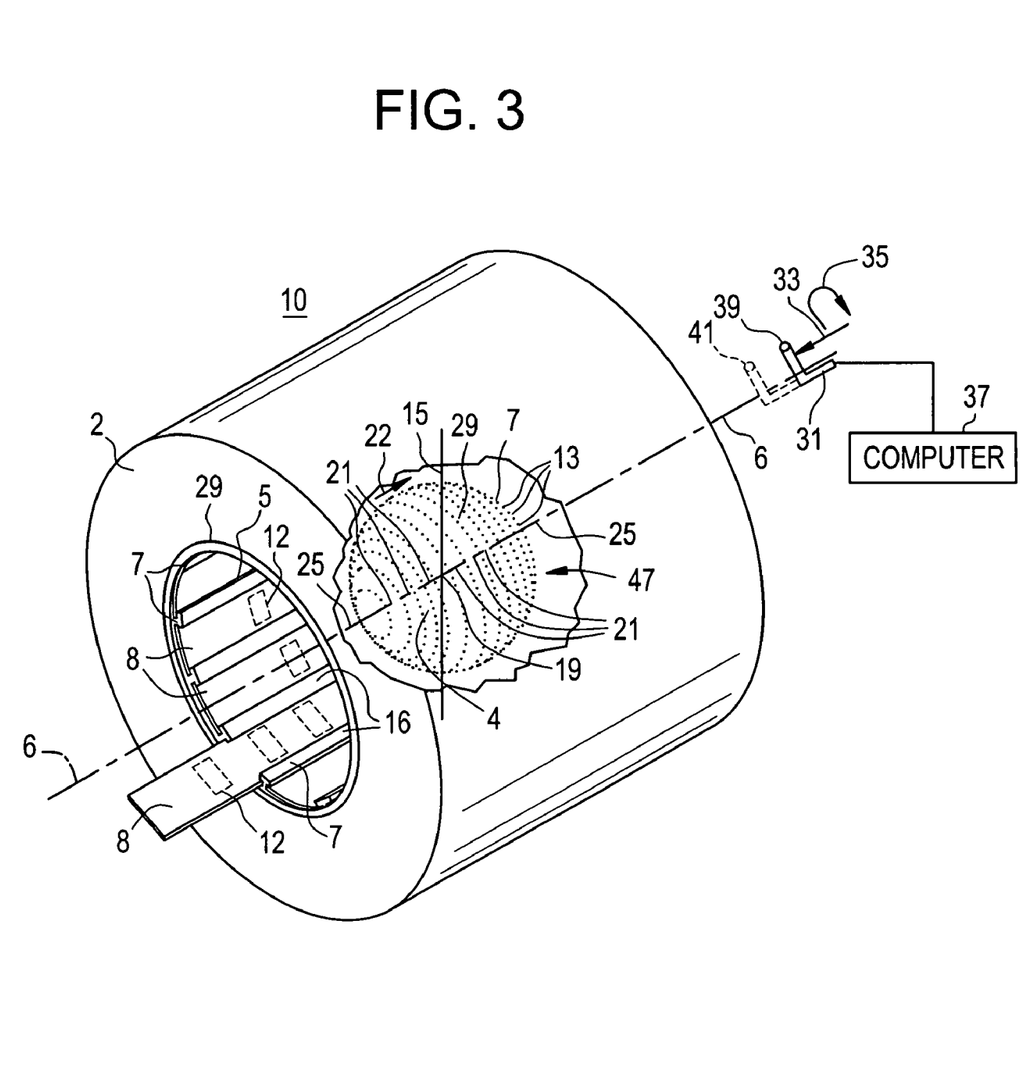
FIG. 3 is a partially cutaway perspective view of an MRI magnet with an internal imaginary enlarged spherical grid to illustrate the location of field measurements and circumferentially disposed shim trays in accordance with an exemplary embodiment.

Referring to FIG. 3, a superconducting magnet 10 includes a plurality of superconducting coils (not shown) in a helium pressure vessel (not shown) within vacuum vessel 2 to provide a magnetic field in the central axial imaging volume 4 of the magnet along axis 6 in the manner well known in the art. Equally spaced along the interior surface of vacuum vessel 2 along bore 5 are a plurality of axially extending arcuate shaped drawers or trays 8 sliding within slides or rails 17 and carrying a plurality of magnetic shims 12 (shown in phantom) disposed about a length of each tray 8. Eight to sixty drawers 8 are equally spaced around a Z-axis 6 providing about 300 to about 2000 locations for positioning of magnetic shims 12. In practice, a total of some 1–49 shims 12 would typically be placed on a single drawer 8 to provide the magnetic shimming. A plurality of correction coils shown generally as 29 are positioned around axis 6.

Figure 4:
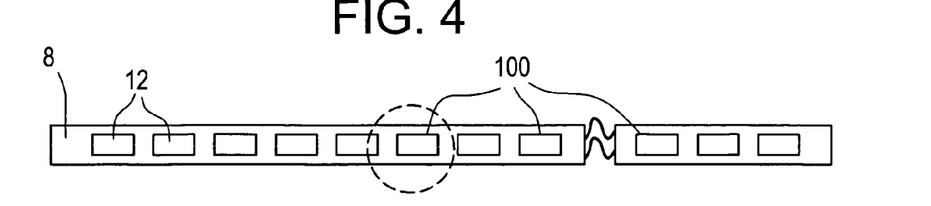
FIG. 4 is a side view of one shim tray of FIG. 3 illustrating a plurality of shim pockets for containing a ferrofluid in accordance with an exemplary embodiment.

Referring now to FIG. 4, a partial side view of an exemplary embodiment of a passive shim tray 8 having an array of magnetic shims 12 is shown removed from magnet 10. Shim tray 8 includes an array of non-magnetic pockets 100 configured to each retain a magnetic fluid 110 therein (see FIG. 5). It is contemplated that pockets 100 may be a plastic material, but other suitable non-magnetic materials are envisioned as well and is not limited to plastic. Each pocket 100 can be configured having either a round or rectangular shape. However, any suitable geometric shape and non-geometric shapes are also contemplated suitable for containing magnetic fluid 110.

Figure 5:
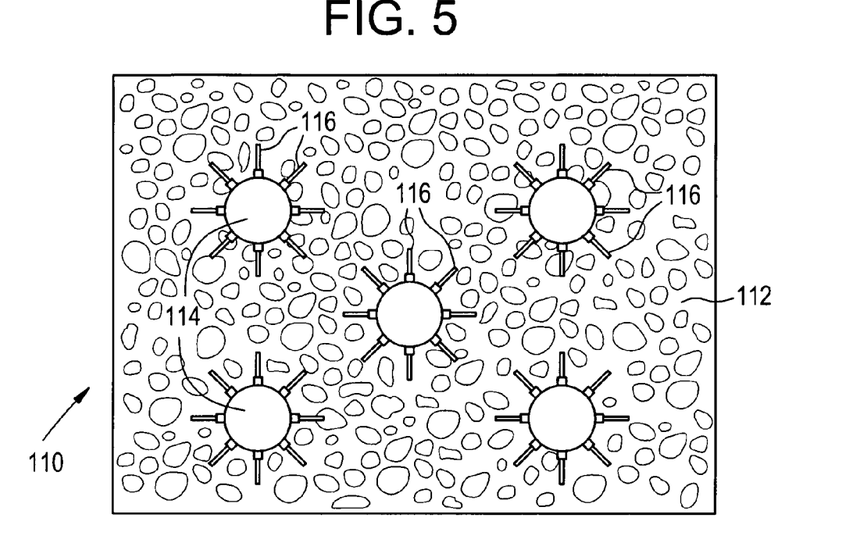
FIG. 5 depicts a ferrofluid coated with a surfactant in a liquid carrier contained in the shim pockets of FIG. 4 in accordance with an exemplary embodiment.

Referring now to FIG. 5, magnetic fluid 110 includes ferrofluids composed of a base liquid 112, ferromagnetic particles 114, and a chemically adsorbed surfactant 116. A wide range of ferrofluids 110 are contemplated in which each is a composite that consists of well-dispersed ferromagnetic ultra-fine particles 114 in a vehicle substrate or base liquid 112. Ferrofluid 110 acts ferromagnetically as a whole since it consists of very small magnetic particles 114 held in suspension in a carrier liquid 112 by a surface-active layer 116. The diameter of each of the magnetic particles 114 ranges from a few nanometers to a few tens of nanometers, and can be tailored to suit individual requirements. Magnetic particles 114 include one of a variety of ferrites or transition metals, such as iron and cobalt, for example, but is not limited thereto. The carrier liquid 112 can be selected to meet the particular application and can be a hydrocarbon, ester, perfluoropolyether, alkyl-naphthalene, water, for example, but is not limited thereto. Surfactant 116 is used to prevent the magnetic particles 114 from settling. The repulsion caused by surfactant 116 prevents aggregation between particles 114. As a result, the magnetic particles 114 are stable enough such there is no separation in either a solid or liquid state. Furthermore, surfactant 116 prevents agglomeration of particles 114 even under a strong magnetic field.

Normally, the concentration of particles 114 and the viscosity of the ferrofluids 110 can be formulated by mixing the ferrofluid 110 with base fluid 112. A ferrofluid is a stable colloidal suspension of single domain or sub-domain particles of ferromagnetic or ferromagnetic materials in a liquid carrier. Particles 114, which may have an average size of about 100 Å (10 nm), for example, are coated with a stabilizing dispersing agent (e.g., surfactant 116) which prevents particle agglomeration even when a strong magnetic field gradient is applied to the ferrofluid. Surfactant 116 is matched to the carrier type and overcomes the attractive van der Waals and magnetic forces between particles 114. The colloid and thermal stabilities, crucial to many applications, are greatly influenced by the choice of the surfactant 116. A typical ferrofluid may contain by volume 5% magnetic solid particles 114, 10% surfactant 116 and 85% carrier fluid 112, for example.

In the absence of a magnetic field, the magnetic moments of the particles 114 are randomly distributed and the fluid 110 has no net magnetization. When a magnetic field is applied to ferrofluid 110, the magnetic moments of the particles 114 orient along the field lines almost instantly. The magnetization of the ferrofluid 110 responds immediately to the changes in the applied magnetic field and when the applied field is removed, the moments randomize quickly.

In a gradient field the whole fluid 110 responds as a homogeneous magnetic liquid which moves to the region of highest flux. This means that ferrofluids can be precisely positioned and controlled by an external magnetic field. The forces holding the magnetic fluid in place are proportional to the gradient of the external field and the magnetization value of the fluid. This means that the retention force of a ferrofluid can be adjusted by changing either the magnetization of the fluid or the magnetic field in the region. For purposes of the present invention, this means that specified pockets 100 can be altered before solidifying the magnetic fluid therein to alter the magnetic field discussed more fully below.

Figure 6:
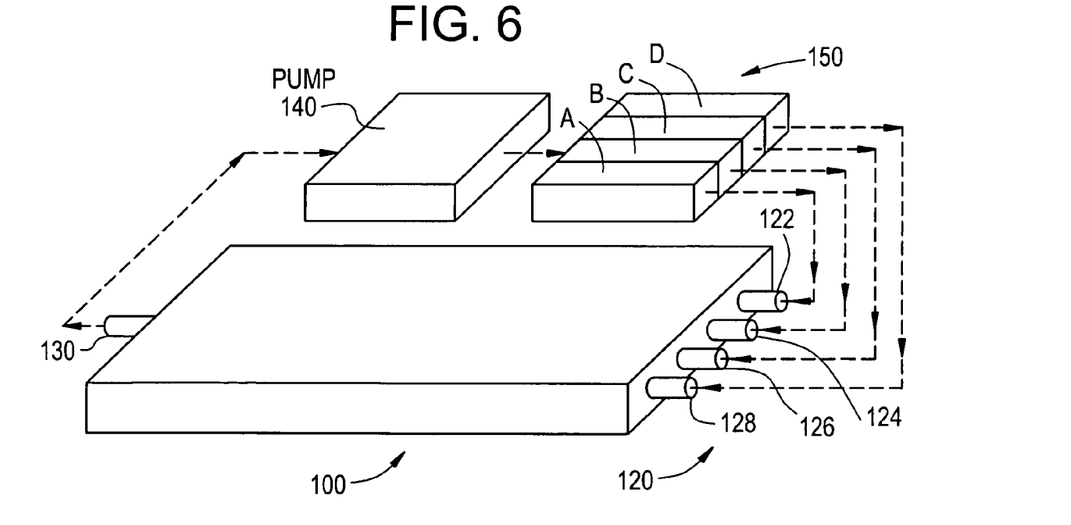
FIG. 6 is an enlarged perspective view on one of the shim pockets of FIG. 4 illustrating an outlet port and four inlet ports in fluid communication with a pumping apparatus and reservoirs for a magnetic fluid, a diluting fluid, a hardener, and an accelerator in accordance with an exemplary embodiment.

Referring now to FIGS. 4–6, the method and apparatus for passive shimming with ferrofluids will be described in further detail. Shim tray 8 includes a plurality of serially aligned non-magnetic pockets 100. Each shim pocket 100 includes a plurality of inlets 120 and an outlet 130 allowing fluids into and out of pocket 100, respectively. The inlets 120 include a first inlet 122 used for injecting base ferrofluids 110 (A), a second inlet 124 used for diluting with a liquid (B), a third inlet 126 used for an accelerator agent (C), and a fourth inlet 128 used for hardener (D). The outlet 130 is used for pumping out ferrofluid 110 and liquid (B) if modification or adjustment is needed during shimming iterations. A pumping apparatus 140 is used to pump ferrofluid 110 and liquid 112 from outlet 130. Pumping apparatus 140 is also schematically shown to operably pump respective fluids (e.g., A, B, C, D) from a container 150, segregated to hold respective fluids, into respective inlets 122, 124, 126, 128, respectively.

Figure 7:
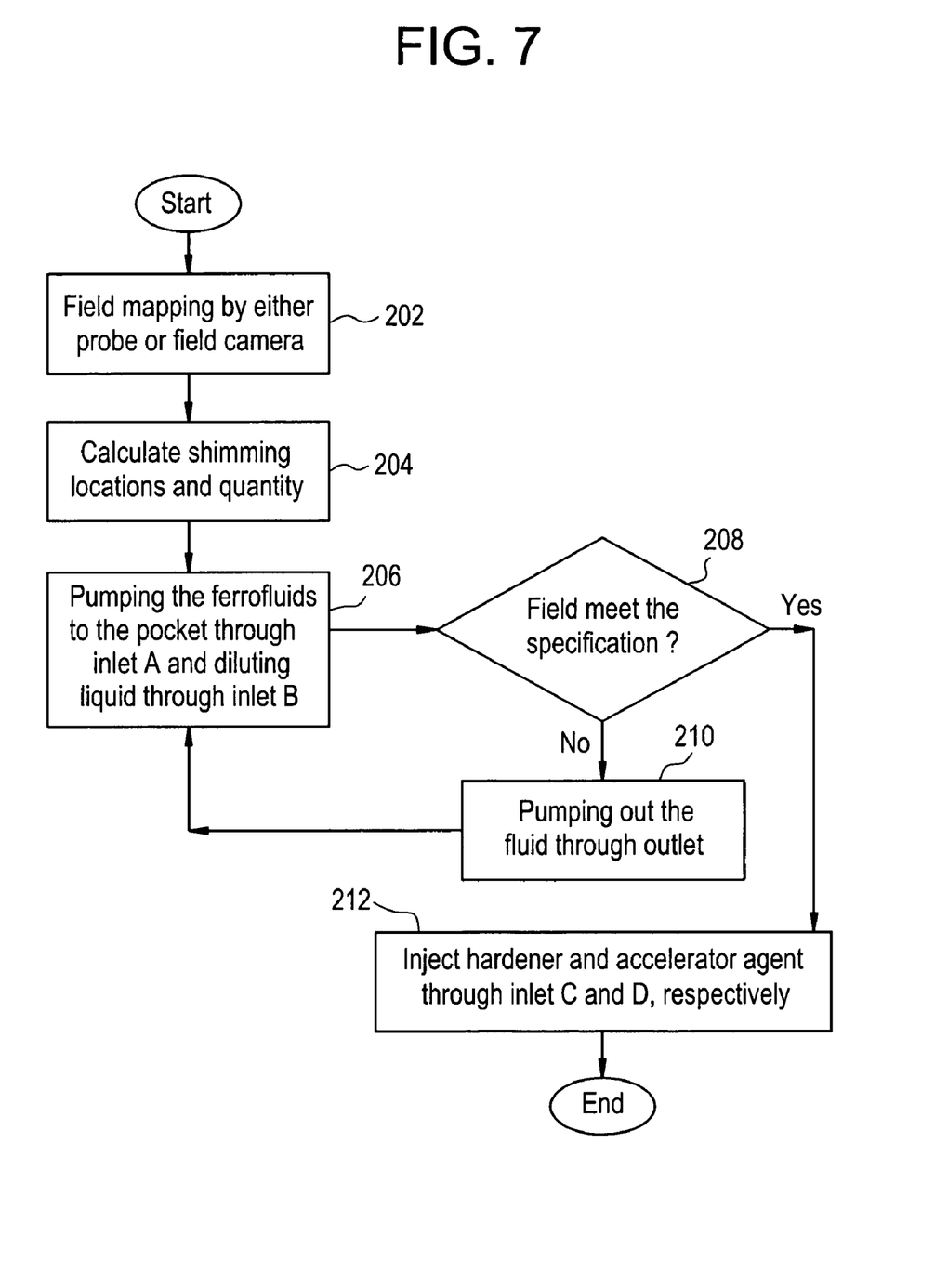
FIG. 7 is a flowchart of a process illustrative of passive shimming with ferrofluids in accordance with an exemplary embodiment.

A flowchart generally shown at 200 illustrates a process for passive shimming with ferrofluids in FIG. 7. Referring now to FIGS. 6 and 7, the method includes field mapping by using either a probe or field camera at block 202. A shimming calculation based on calibration by the ferrofluids for quantity and location is conducted at block 204. Next, ferrofluid 110 is pumped into pocket 100 through inlet A and diluted with liquid 112 through inlet B one-by-one or by automatic controller at block 206. Field mapping is conducted again at block 208. If more iteration is needed for a specified pocket 100, ferrofluid 100 and diluting liquid 112 is pumped out through outlet 130 at block 210. Then new ferrofluid 110 and diluting liquid 112 is injected or pumped into respective inlets 122, 124, respectively at block 206.

When the magnetic field meets the specification (e.g., desired magnetic field) at block 208, a hardener indicated as (C) and an accelerator agent indicated as (D) in container 150 is injected or pumped into inlets 126 and 128, respectively, at block 212. In this manner, the ferrofluid 110 along with the diluting fluid 112 become solidified upon curing with the introduction of the hardener (C) and accelerator agent (D) in pocket 100.

The amount of ferrofluid 110 and diluting liquid 112, as well as the location of each pocket 100 and the required current in each shim coil, must be determined to provide the required shimming. With some 300 or more possible locations and 10 or more correction coil currents, it is obvious that the above process involves trial and error with respect to calculating a ferromagnetic particle amount for each shim. However, the above described process facilitates passive shimming by eliminating the quantumize process since the calculated ferromagnetic particle amount can be adjusted by diluting the ferrofluid 110 with base liquid 112. Furthermore, since loading and unloading of the shim trays is not necessary, introduction of mechanical errors associated with such loading and unloading of the shim trays is avoided. Moreover, the above described passive shimming process can be automated, thus saving time during iteration and modification.

Referring again to FIGS. 3 and 7, the magnetic field present around imaging volume 4 after manufacture is measured or mapped in order to determine proper placement of magnetic shims 12 at block 202. Measurement points are shown as dots 13 with imaging volume 4 being centered around the intersection 19 of Z-axis 6 and centerline 15 of cylindrical vacuum vessel 2.

The magnetic field strength of the magnetic field indicated generally by arrow 22 is measured at each test point 13, 21 and 25. Correction coils such as 29 provide superconducting correction current flow to correct for inhomogeneities in magnetic field 22. A nuclear magnetic resonance (NMR) probe 31, which measures a magnetic field precisely when combined with a Teslameter, is inserted into bore 5 along axis 6 as schematically indicated by arrow 33. Probe 31 is successively positioned along axis 6 such that the probe may be rotated as indicated by arrow 35 around circles 17 to read the magnetic field at each test point 13 of the circle, before being moved to the next circle or vertical plane, and the process repeated until all of the test point circles are measured and test points 21 and 25 are measured. The measured field information is then provided to computer 37 to enable mapping of the field.

Alternatively, probe 31 can include multiple spaced sensors such as 39 (one of which is shown dotted as 41) such that a single positioning of the probe within imaging volume 4 and a single angular rotation 35 will provide multiple readings. With only 2 probes, such as shown in FIG. 3, each pair of testing circles at equal axial distances on either side of the largest diameter or central circle 29 may be mapped simultaneously reducing the positioning of the probes and test time almost in half.

A general procedure for calculating the appropriate shim properties and locations and/or shim coil currents for a single magnet 10 thus involves measuring magnetic field 22 at test points 13, 21 and 25 and is described in U.S. Pat. No. 6,181,137, assigned to the assignee of the present application, the contents of which are incorporated herein in their entirety.

The above described passive shimming method and system using ferrofluids provide a flexible feature for different magnet assembly configurations. In particular, the location and shim pocket can be a variety of shapes and configurations when using ferrofluids to acquire the requisite iron amount via ferromagnetic particles first in fluid and then solidified. Furthermore, passive shimming with ferrofluids provides a safe and enclosed process, which can save time when the ferrofluids are employed with an auto-machine.

The advantages of using ferrofluids over iron shim chips of the prior art allows a magnet to be shimmed in an automatic fashion, as well as allowing greater flexibility in adjusting iron content for a specified pocket. The ferrofluid and its sensitivity can be selected to suit different magnet types. The ferrofluids shim pocket array can also be designed in different sizes and shapes to suit different magnet types. Furthermore, the passive shimming process with ferrofluids avoids the loading and unloading of the shim trays as used in the conventional magnet shimming process of the prior art.

While the invention is described with reference to exemplary embodiments, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiments disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

What is claimed is:

1. An apparatus for shimming a magnetic field of a magnet in a volume of interest comprising:
   a nonmagnetic holder configured with an array of fluid containing pockets;
   a ferrofluid comprising ferromagnetic particles, and a diluting liquid in each pocket of the array of fluid containing pockets, the ferrofluid being in a solidified state in response to being chemically cured via a hardener, and an accelerator agent; and
   a pump configured to pump the ferrofluid the diluting liquid, the hardener, and the accelerator agent to each pocket.

2. The apparatus of claim 1, wherein the ferrofluid further comprises a surfactant.

3. The apparatus of claim 1, wherein the ferromagnetic particles include a variety of ferrites or transition metals.

4. The apparatus of claim 1, wherein the ferromagnetic particles include at least one of iron and cobalt.

5. The apparatus of claim 1, wherein the diluting liquid is at least one of a hydrocarbon, ester, perfluorpolyether, alkyl-naphthalene, and water.

6. The apparatus of claim 1, wherein each pocket includes an inlet receptive to filling the pocket with the ferrofluid, the diluting liquid, the hardener, and an accelerator agent.

7. The apparatus of claim 6, wherein each pocket includes a separate inlet receptive to filling the pocket with one of a respective ferrofluid, the diluting liquid, the hardener, and an accelerator agent.

8. The apparatus of claim 6, wherein each pocket includes an outlet receptive to emptying at least the ferrofluid and the diluting liquid from the pocket.

9. The apparatus of claim 1, wherein the pump is configured to pump at least the ferrofluid and the diluting liquid from each pocket.

10. The apparatus of claim 1, wherein a magnetic characteristic of the solidified ferrofluid is variably adjusted by selecting an amount of ferromagnetic fluid and diluting liquid while in a liquid state.

11. The apparatus of claim 1, wherein the array of pockets are configured having at least one of a shape and size suitable to different types of magnets.

12. A method for shimming a magnetic field of a magnet in a volume of interest, wherein the magnet is configured to utilize, for shimming, a ferromagnetic material positioned in a nomnagnetic bolder having a predetermined number of pockets, the method comprising:
   measuring the magnetic field of a magnet in plurality of locations within the volume of interest;
   determining a nominal passive shimming location and quantity to compensate the measured magnetic field to approximate a desired magnetic field within the volume of interest;
   filling a pocket with a ferrofluid and a diluting fluid according to the determined nominal passive shimming location and quantity;
   remeasuring the magnetic field of the magnet in a plurality of locations within the volume of interest to determine a residual deviation from the desired magnetic field;
   determining whether the measured magnetic field meets the desired magnetic field;
   emptying the pocket of the ferrofluid and the diluting fluid if the desired magnetic field is not met; and
   filling the pocket with a hardener and an accelerator agent, thereby causing the ferrofluid to be in a solidified state via chemical curing, if the pocket meets the desired magnetic field.

13. The method of claim 12, further comprising:
   refilling the pocket with a different amount ferrofluid and diluting fluid after emptying the pocket of the ferrofluid and the diluting fluid if the desired magnetic field is not met.

14. The method of claim 12, wherein the ferrofluid and the diluting fluid are injected into respective inlets of each pocket and emptied through an outlet of each respective pocket.

15. The method of claim 14, wherein the hardener and the accelerator agent injected into respective inlets of each pocket.

16. The method of claim 14, wherein the ferrofluid, the diluting fluid, the hardener, and the accelerator agent are injected while the ferrofluid and the diluting fluid are emptied from each pocket by automatic means.

17. The method of claim 16, Wherein the automatic means includes a pump apparatus.

18. The method of claim 12, wherein said remeasuring the magnetic field, determining if desired magnetic field is met, emptying and filling the pocket are performed more than once to further reduce a measure of the residual deviation from the desired magnetic field.

19. A method for shimming, within an imaging volume, a magnetic field of a magnet of an MRI apparatus, wherein the magnet is configured to utilize, for shimming a ferromagnetic material positioned in a nonmagnetic holder having a predetermined number of fluid retaining pockets, the method comprising:
   measuring the magnetic field of the magnet in a plurality of locations within the imaging volume;
   determining a nominal passive shimming location and quantity to compensate the measured magnetic field to approximate a desired magnetic field within the imaging volume;
   placing a combination of a chemically curable ferrofluid and a diluting fluid in the pockets to approximate the nominal passive shimming location and quantity;
   remeasuring the magnetic field of the magnetic in a plurality of locations within the imaging volume to determine a residual deviation from the desired magnetic field;
   determining a normal shimming location and quantity change required to compensate for the residual deviation; and
   adjusting the combination of the ferrofluid and diluting fluid in the holder in accordance with an approximation of the nominal shimming location and quantity change.

20. The method of claim 19, wherein the adjusting the combination of the ferrofluid and diluting fluid includes emptying the holder of the ferrofluid and the diluting fluid if the desired magnetic field is not met and refilling the holder with a different combination of the ferrofluid and diluting fluid.

21. The method of claim 20, further comprising filling the holder with a hardener and an accelerator agent if the holder meets the desired magnetic field.

22. The method of claim 19, wherein the remeasuring the magnetic field, determining the nominal shimming location and quantity change, and adjusting the combination of the ferrofluid and the diluting fluid are performed more than once to further reduce a measure of the residual deviation from the desired magnetic field.

* * * * *

UNITED STATES PATENT AND TRADEMARK OFFICE
CERTIFICATE OF CORRECTION

PATENT NO. : 7,196,520 B2 Page 1 of 1
APPLICATION NO. : 10/904094
DATED : March 27, 2007
INVENTOR(S) : Weijun Shen et al.

It is certified that error appears in the above-identified patent and that said Letters Patent is hereby corrected as shown below:

Column 7:
Line 56, after "of", insert --the--;
Line 64, after "nonmagnetic", delete "bolder" and insert therefor --holder--;

Column 8:
Line 21, after "amount", insert --of--;
Line 58, after "the", delete "magnetic" and insert therefor --magnet--.

Signed and Sealed this

Third Day of July, 2007

JON W. DUDAS
*Director of the United States Patent and Trademark Office*